BINARY COUNTER PRODUCING OUTPUT SIGNALS BY TRANSMISSION OF ALTERNATE INPUT SIGNALS THROUGH A PRE-CONDITIONED GATE, AND MULTIVIBRATOR SYSTEM FOR SAID COUNTER

Filed June 30, 1958

INVENTOR.
FREDERICK N. BRAUER
BY Herbert Epstein
AGENT

United States Patent Office 3,093,750

Patented June 11, 1963

3,093,750

BINARY COUNTER PRODUCING OUTPUT SIGNALS BY TRANSMISSION OF ALTERNATE INPUT SIGNALS THROUGH A PRE-CONDITIONED GATE, AND MULTIVIBRATOR SYSTEM FOR SAID COUNTER

Frederick N. Brauer, Meadowbrook, Pa., assignor, by mesne assignments, to Philco Corporation, Philadelphia, Pa., a corporation of Delaware Filed June 30, 1958, Ser. No. 745,701

15 Claims. (Cl. 307—88.5)

Figure 1:
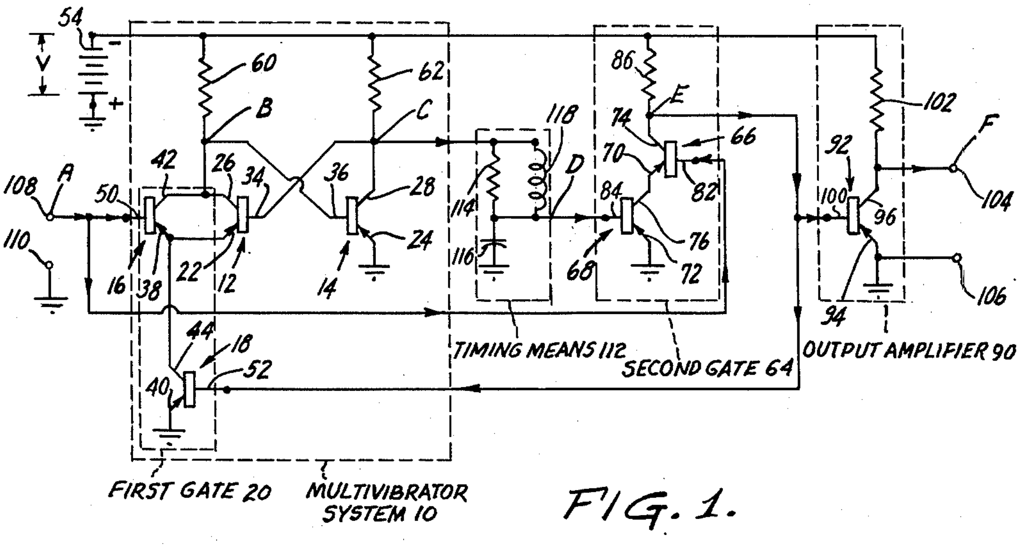

This invention relates to a binary counter and a multivibartor system usable therein.

Binary counters are electrical systems which produce a single output pulse in response to every other input pulse supplied thereto. In many prior-art binary counters, there is a substantial time lag between the leading edge of an input pulse and the leading edge of the output pulse produced in response thereto. This lag occurs because the output pulse is produced by a bistable device, e.g. a bistable multivibrator, which operates to produce such a pulse only on appreciable time after the input pulse triggers it. The lag is undesirable particularly in those synchronous computer applications wherein the output pulse of each binary counter must be concurrent with the input pulse producing it. The lag becomes more objectionable as the repetition rate of the input pulses rises and their duration decreases.

Accordingly an object of the invention is to provide a binary counter.

Another object is to provide a binary counter having an unusually rapid response to input signals supplied thereto.

Another object is to provide a transistor binary counter having such rapid response.

Another object is to provide a binary counter especially well adapted for use in direct-coupled circuits.

Another object is to provide a binary counter especially well adapted for use in rapid synchronous computers.

Another object is to provide a transistor multivibrator system.

Another object is to provide such a system which is especially well adapted for use in the binary counter of the invention.

The binary counter of the invention produces an output pulse the leading edge of which is substantially concurrent with the leading edge of every other input pulse supplied thereto, by transmitting every other input pulse directly to the output terminal of the counter by way of an "and" gate. The "and" gate comprises a first input terminal to which the successive input pulses are supplied, and a second input terminal to which a control signal is supplied. When the control signal has a first value, the gate is conditioned to transmit the input pulse to the output terminal, i.e. the gate is "open." When the control signal has a second value, the gate is conditioned to block such a transmission, i.e. the gate is "closed." This control signal is produced by a bistable device, e.g. a multivibrator, and timing means coupling the output terminal of the bistable device to the second input terminal of the "and" gate. The changes in conduction state of the bistable device are synchronized with successive input pulses by gating means having two input terminals to which are respectively supplied the input and output pulses of the counter. When the counter produces an output pulse, the latter means are responsive thereto to actuate the bistable device to produce a signal which when supplied to the "and" gate via the timing means closes that gate. When no output pulse is produced, the gating means are responsive to the input pulse to actuate the bistable device to produce a signal which when supplied to the "and" gate via the timing means opens that gate. In accordance with the invention, the timing means are constructed and arranged to delay transmission to the "and" gate of signals produced by the bistable device until after the end of each input pulse, and to transmit such signals to the "and" gate before the next input pulse. Under these conditions, the "and" gate is conditioned either to block or transmit the next input pulse at the time this pulse is applied thereto and hence is able immediately to transmit alternate input pulses to the output terminal of the counter.

The preferred embodiment of the invention comprises a novel transistor multivibrator system described hereinafter.

Figure 2:
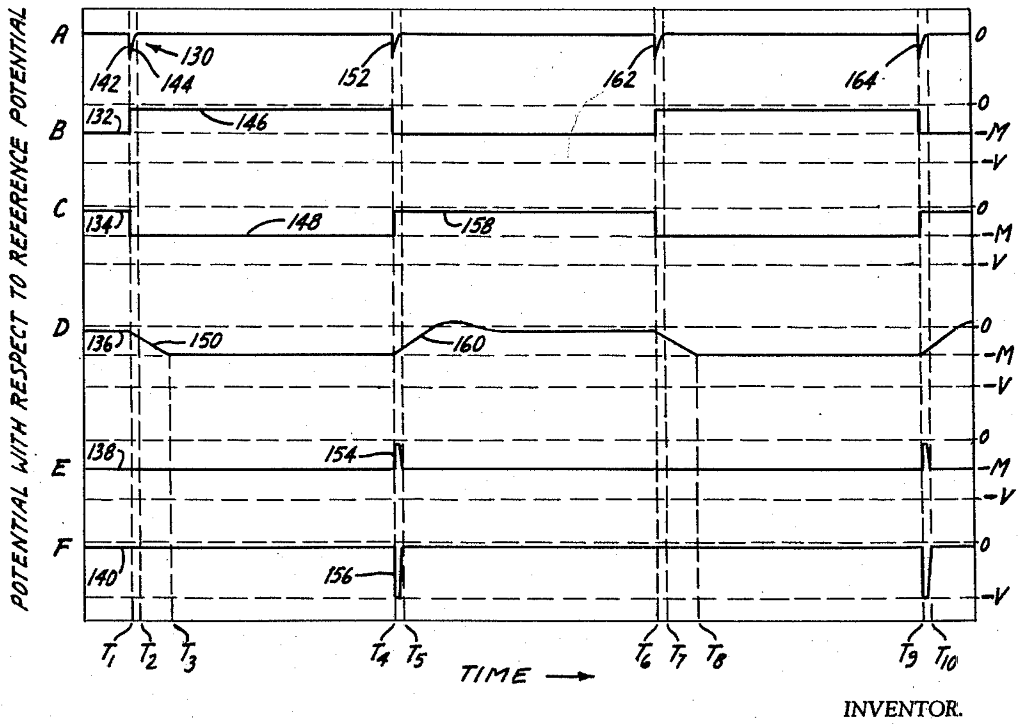

Other advantages and features of the invention will become apparent for a consideration of the following detailed description, taken in connection with the accompanying drawings, in which:

FIG. 1 is a schematic diagram of a preferred form of the binary counter of the invention; and FIG. 2 is a graphical representation of waveforms generated in the arrangement of FIG. 1.

The binary counter of the invention shown in FIG. 1 comprises a multivibrator system 10 including first gating means 20 to control its conduction state, second gating means 64 (to one terminal of which all input pulses are supplied and which transmit alternate ones of these pulses to output terminals 104, 106 via an output amplifier 90) and timing means 112 (which supply the signals produced by multivibrator system 10 to the second input terminal of gate 64 to condition the latter either to transmit or block transmission of the next input signal by gate 64). Multivibrator system 10 comprises switching transistors 12 and 14, the collector and base electrodes of which are cross-coupled in conventional manner. Load resistors 60 and 62 respectively connect collectors 26 and 28 of transistors 12 and 14 to a source 54 of a constant unidirectional voltage V. Emitter electrode 24 is connected to a point at reference potential. First gating means 20 comprise transistors 16 and 18 connected in novel combination with transistors 12 and 14. In particular, the emitter electrode 38 and collector electrode 42 of transistor 16 are respectively connected to emitter electrode 22 and collector electrode 26 of transistor 12. Emitter electrode 38 of transistor 16 is connected to collector electrode 44 of transistor 18, and emitter electrode 40 of transistor 18 is connected to said point at reference potential. The novel coaction of the third and fourth transistors with the first and second transistors and other elements of system 10 is described hereinafter. Transistor multivibrator systems of the general form discussed above, of which system 10 is an improvement, are described and claimed in U.S. Patent No. 2,967,951 of Ralph B. Brown.

Second gating means 64 comprise series-connected transistors 66 and 68 and a load resistor 86 connecting collector 74 of transistor 66 to source 54. Output amplifier 90 comprises a transistor 92 connected in common-emitter configuration and a load resistor 102 connecting collector 96 to source 54. Timing means 112 comprise a resistor 114 and a capacitor 116 serially connected between collector electrode 28 and said point at reference potential, and an inductor 118 shunting resistor 114. Input terminal 108 is connected directly to base electrodes 50 and 82 of transistors 16 and 66 respectively. Collector electrode 74 is connected directly to base electrodes 52 and 100 of transistors 18 and 92 respectively.

FIG. 2 illustrates diagrammatically six voltage waveforms generated in the counter at six points respectively designated in FIG. 1 by the letters A to F. The axis of abscissas of FIG. 2 represents time, and the axis of ordinates of each waveform represents the magnitude and sense thereof with respect to reference potential, here designated as zero.

The binary counter of FIG. 1 operates in one of two modes in response to an input pulse applied between terminals 108, 110. The particular mode depends on which one of transistors 12 and 14 is conductive at the time the input pulse is applied. The counter operates in the first mode when transistor 12 is non-conductive and transistor 14 is conductive, and operates in the second mode when transistor 12 is conductive and transistor 14 is non-conductive.

*Mode 1*

At a time just before the time $T_1$ at which an input pulse 130 (waveform A) is applied between input terminals 108 and 110, the input voltage between terminals 108 and 110 is substantially zero. Transistor 12 is non-conductive and transistor 14 is conductive. Hence the voltage at point C is substantially zero (see waveform C at 134). This voltage is applied to base electrode 84 of transistor 68 via inductor 118. Because inductor 118 has a resistance low compared to the resistance of resistor 62, the voltage applied to electrode 84 is substantially equal to that at point C. The applied voltage is less negative than M, the magnitude required to forward-bias the emitter-base path of transistor 68. As a result, transistors 66 and 68 are both cut off, and the potential at point E is sufficiently negative to forward-bias the base-emitter path of transistor 92 and turn on that transistor. This potential is shown in waveform E at 138. Because transistor 92 is turned on, collector current of substantial magnitude flows through load resistor 102, and collector electrode 96 is established at a potential just slightly more negative than zero (see waveform F at 140).

The negative potential at point E also is applied to base electrode 52 of transistor 18, thus forward-biasing its emitter-base path. However transistor 12 is non-conductive and zero voltage is then being applied to the base electrode 50 of transistor 16. As a result, transistor 16 is cut off and transistor 18 conducts no collector current.

The following list summarizes the respective conduction states of the transistors in the counter just before input pulse 130 is applied between input terminals 108 and 110:

| | |
|---|---|
| Transistor 12 | Non-conductive. |
| Transistor 14 | Conductive. |
| Transistor 16 | Non-conductive. |
| Transistor 18 | Non-conductive; base-emitter path forward-biased. |
| Transistor 66 | Non-conductive. |
| Transistor 68 | Do. |
| Transistor 92 | Conductive. |

Input pulse 130 extends from zero to a negative voltage sufficiently great to drive transistors 16 and 66 into conduction when applied to their base electrodes and when their emitter electrodes are at reference potential. In addition the duration ($T_1$—$T_2$) of pulse 130 is critically related to the form of the control voltage supplied by timing means 112 to base electrode 84 of transistor 68 (see waveform D). This relationship is discussed hereinafter.

When input pulse 130 is applied between terminals 108 and 110, it drives base electrode 82 of transistor 66 to a negative potential. However, because the base-emitter path of transistor 68 is substantially non-conductive, the emitter return path of transistor 66 is open-circuited and pulse 130 cannot turn on transistor 66. Hence no output signal is produced at E or F in response to pulse 130 (see waveforms E and F). Moreover, as described more fully hereinafter, base 84 of transistor 68 is maintained sufficiently near zero potential during the entire interval $T_1$—$T_2$ that no portion of pulse 130 can turn on transistor 66.

Input pulse 130 also is applied to base electrode 50 of transistor 16. Because the emitter-collector path of transistor 18 is forward-biased, pulse 130 turns on transistors 16 and 18. As a result, a current flows through resistor 60, raising the potential at B almost to zero potential (see waveform B at 146). This raised potential at B turns off transistor 14, thereby causing the potential at C to fall to a more negative value (see waveform C at 148). The latter potential turns on transistor 12.

The new potential at point C is sufficiently negative to forward-bias the base-emitter path of gate transistor 68. However, in accordance with the invention, the values of resistor 114, capacitor 116 and inductor 118 of timing means 112 are such as to delay the fall in potential at base electrode 84 to a value M sufficiently negative to turn on the base-emitter path of transistor 68 until after pulse 130 has ended ($T_2$). (See waveform D at 150.) Hence, as aforementioned, input pulse 130 cannot turn on transistor 66 and produces no output signal at points E and F.

At a time $T_3$ after the termination of input pulse 130 but before the application of the next pulse 152, the delayed gating signal 150 attains the critical potential M required to forward-bias the base-emitter path of transistor 68. Accordingly at and after $T_3$, transistors 66 and 68 can be turned on merely by applying a sufficiently negative potential to base electrode 82. Because multivibrator system 10 operates bistably, it continues to supply the negative forward-biasing potential to base electrode 84 via timing means 112 until the next input pulse 152 is applied between input terminals 108, 110. Moreover the base-emitter path of transistor 68 remains forward biased for a time substantially greater than the duration of pulse 152 because timing means 112 delays sufficiently the transmission to base electrode 84 of all changes in potential occurring at point C.

*Mode 2*

Just before $T_4$, the transistors of the counter are in the following conduction states:

| | |
|---|---|
| Transistor 12 | Conductive. |
| Transistor 14 | Non-conductive. |
| Transistor 16 | Do. |
| Transistor 18 | Conductive. |
| Transistor 66 | Non-conductive. |
| Transistor 68 | Non-conductive; base-emitter path forward-biased. |
| Transistor 92 | Conductive. |

At time $T_4$, input pulse 152 (see waveform A) is applied between input terminals 108, 110. Because the base-emitter path of transistor 68 is forward biased, the pulse turns on transistors 66 and 68. The resultant flow of collector current through resistor 86 produces a positive-going voltage pulse at point E (see waveform E at 154). Preferably the amplitude of input pulse 152 is sufficient to drive transistor 66 into saturation, thereby to produce an output pulse 154 having a relatively flat top. Because pulse 154 is produced in direct response to input pulse 152 by the amplifier action of transistors 66 and 68, the leading edge of pulse 154 substantially coincides with that of input pulse 152 and the duration of pulse 154 does not exceed that of pulse 152.

Positive-going pulse 154 is supplied to base electrode 100 of transistor 92 and cuts off the latter transistor. Hence the potential at collector 96 falls to a value substantially equal to the source potential (minus V) and remains at this value substantially until the end of pulse 154. At that time, transistor 66 is again cut off by the zero input voltage and transistor 92 resumes conduction. The negative-going pulse generated at collector electrode 96 appears between output terminals 104, 106 respectively (see waveform F at 156).

Pulse 154 also is applied to the base electrode 52 of transistor 18 and cuts off this transistor. As a result the emitter returns of transistors 12 and 16 are open-circuited, thereby cutting off transistor 12 and rendering transistor 16 incapable of being driven into conduction by input pulse 152. Because transistors 12 and 16 are both cut off, the potential at point B falls to a negative value sufficient to turn on transistor 14. As a result, the potential at C rises toward zero potential, maintaining transistor 12 cut off even after pulse 154 ends.

The positive-going change in voltage at point C is supplied by timing means 112 to base 84. However because of the wave-shaping action of timing means 112, the voltage 160 (waveform D) applied to base 84 rises to a value sufficiently close to reference potential to cut off transistor 68 only after the end of input pulse 152. Hence transistor 68 is conditioned to conduct for the entire duration ($T_4$—$T_5$) of pulse 152 and transistor 66 can conduct in response to substantially all portions thereof. Nonetheless, before the next input pulse 162 is applied at a time $T_6$, control voltage 160 has risen to value substantially equal to the steady-state potential of collector electrode 28 (i.e. a value almost equal to zero potential), and has cut off the base-emitter path of transistor 68.

All transistors are now in the same conduction states as they were just before pulse 130 was applied. Hence pulse 162 actuates the counter to operate in accordance with mode 1 set forth above. Similarly an input pulse 164 following pulse 162 actuates the counter to operate in accordance with mode 2.

The multivibrator system 10 comprising transistors 12, 14, 16 and 18 respectively is itself a novel and useful arrangement. By utilizing both emitter gating and collector gating of a single multivibrator transistor, i.e. transistor 12, one pair of output terminals of the multivibrator system is freed of gating equipment. Moreover multivibrator system 10 can be reset into the mode 1 condition (transistor 12 non-conductive and transistor 14 conductive) merely by applying a potential substantially equal to reference potential to base electrode 52. This feature is particularly advantageous in computers which embody numerous binary counters, because it permits all counters to be placed into the mode 1 condition by a single positive-going pulse.

The following values for the components of the counter shown in FIG. 1 have been found to give reliable performance:

| | |
|---|---|
| Transistors **12**, **14**, **16**, **18**, **66**, **68** and **92** | Each a surface-barrier transistor Type 2N240. |
| Resistors **60**, **62**, **86** and **102** | Each 1.5 kilohms. |
| Battery **54** | 3 volts D.-C. |
| Timing means **112**: | |
| Resistor **114** | 3.3 kilohms. |
| Capacitor **116** | 3000 micromicrofarads. |
| Inductor **118** | 2 millihenries. |
| Input signal characteristics: | |
| Amplitude of each input pulse | 0.4 volt. |
| Duration of each input pulse | 2 to 3 microseconds. |
| Pulse repetition rate | $5\times10^4$ per second. |

When it is desired to use input pulses having widths even narrower than two microseconds, e.g. as narrow as 0.3 microsecond, the following values for the components of timing means 112 have been found to be advantageous: resistor 114, 510 ohms; capacitor 116, 510 micromicrofarads; inductor 118, 100 microhenries. When components having these values are used, the binary counter responds reliably to successive input pulses having a repetition rate as high as $10^6$ per second.

The foregoing specific parameter values are merely exemplary and I do not intend to limit my invention thereto.

The various structural elements of the counter specifically described above may be replaced by equivalent elements without altering essentially the mode of operation of the counter. For example, timing means 112 alternatively may comprise a delay line, e.g. of one of the forms described in "Waveforms," edited by B. Chance et al. (McGraw-Hill, 1949), at pages 730 to 765.

Furthermore timing means 112 need not comprise a structure distinct from second gating means 64, but alternatively may comprise a structure which is an integral element of means 64. In one such arrangement, resistor 114, capacitor 116 and inductor 118 are omitted and collector electrode 28 is connected to base electrode 84 by a low-resistance wire. Transistor 68 is selected to have "on" and "off" switching times exceeding the duration of each of the successive input pulses. Such a slow-switching transistor inherently provides the time delay necessary to the operation of the binary counter. In a specific embodiment in which the input pulses have a duration of the order of two or three microseconds and the pulse repetition rate is $5\times10^4$ per second, a Type 2N207 transistor is suitable for use as transistor 68 because the latter type is characterized by "on" and "off" switching times of several microseconds each.

Other forms of bistable devices may be substituted for multivibrator 10. Because the bistable device is not employed directly to generate an output signal but rather to generate a delayed gating signal in cooperation with timing means 112, it is not necessary that the device produce an output signal having a fast rise time. On the contrary, a device producing output pulses having relatively long rise times may be preferred in some instances because the amount of delay required to be provided by timing means 112 is then lessened as compared to that required when a bistable device producing pulses having short rise times is employed. Indeed by utilizing a bistable device the successive output signals of which attain amplitudes respectively required to forward-bias and reverse bias the base-emitter path of transistor 68 only after the end of the successive input pulses triggering the device, timing means 112 may be eliminated and the output signals of the bistable device supplied directly to base electrode 84. In another arrangement the output terminal of a bistable device producing an output signal of relatively long rise time is connected directly to the base electrode of a transistor 68 having a relatively slow switching time. In this arrangement, the long rise time of the output signal and slow switching time of the transistor are jointly employed to provide the requisite delay.

In the drawing, all transistors have been shown as having n-type bases. Alternatively the transistors may have p-type bases. In such an embodiment, the polarity of source 54 is reversed and input pulses of positive polarity are applied between terminals 108 and 110 to actuate the counter. The transistors need not be surface-barrier transistors as specifically described above, but for example may be junction or microalloy transistors.

An output signal having a sense opposite that of the input signals supplied to the counter can be derived at collector 74. Where only this output signal is needed, output stage 90 may be omitted.

Two concurrent output signals of opposite sense can be derived respectively between collector electrode 74 and terminal 106 and between terminals 104 and 106.

While the counter embodiments specifically described herein employ transistor switching circuits, the counter alternatively may employ switching circuits utilizing other switching elements. For example, in place of the transistor circuits, vacuum-tube switching circuits of well known construction may be employed. Alternatively magnetic relay switching circuits, or appropriate combinations of transistor, electron tube and magnetic switching circuits, may be employed.

While I have described my invention by means of specific examples and in a specific embodiment I do not wish to be limited thereto, for obvious modifications will occur to those skilled in the art without departing from the scope of my invention.

I claim:

1. A binary counter comprising a bistable multivibrator having an output terminal and first gating means including first and second input terminals for controlling the conduction state of said multivibrator; second gating means having first and second input terminals and an output terminal; means for supplying an input pulse to said first input terminals of said first and second gating means; timing means coupling said output terminal of said multivibrator to said second input terminal of said second gating means; means directly connecting said output terminal of said second gating means to said second input terminal of said first gating means; and means coupled to said output terminal of said second gating means for deriving an output signal.

2. The binary counter of claim 1 wherein said second gating means is adapted to produce an output signal only in a single sense and only in response to first and second gating signals having respective given polarities, having magnitudes at least equal to first and second respective values, and applied concurrently to said first and second input terminals thereof; wherein said first gating means is responsive to said output signal of said second gating means to switch said multivibrator from one to the other of its stable operating states; wherein said multivibrator when in said other stable state is responsive to actuation of said first gating means to produce a wave at said output terminal of said multivibrator; and wherein said timing means is responsive to said wave to produce at its output terminal a delayed gating signal having said given polarity of said second gating signal and a magnitude which attains said second value only after a given time interval following the inception of said wave.

3. A binary counter comprising a multivibrator having first and second transistors, each of said transistors having an emitter electrode, a collector electrode and a base electrode, means connecting said base electrode of said first transistor to said collector electrode of said second transistor, means connecting said base electrode of said second transistor to said collector electrode of said first transistor, first and second resistive means respectively connecting said collector electrodes of said first and second transistors to a source of operating voltage, and means connecting said emitter electrode of said second transistor to a point at reference potential; first gating means comprising third and fourth transistors each having an emitter electrode, a collector electrode and a base electrode, means connecting said emitter electrode of said third transistor both to said collector electrode of said fourth transistor and to said emitter electrode of said first transistor, means connecting said collector electrode of said third transistor to said collector electrode of said first transistor, and means connecting said emitter electrode of said fourth transistor to said point at reference potential; second gating means having first and second input terminals and an output terminal, said second gating means being adapted to produce a control signal having only a single sense and only in response to first and second gating signals applied concurrently to said first and second input terminals and having with respect to said reference potential respective given polarities and respective magnitudes at least equal to first and second respective values; said fourth transistor being responsive to the application to its base electrode of said control signal substantially to cut off its emitter-collector current; means directly connecting said output terminal of said second gating means to said base electrode of said fourth transistor; means for supplying to said base electrode of said third transistor and said first input terminal of said second gating means an input signal having said given polarity of said first gating signal, a magnitude with respect to said reference potential at least equal to said first value, and a duration less than a given time interval; timing means having an input terminal connected to said collector electrode of said second transistor and an output terminal connected to said second input terminal of said second gating means, said timing means being responsive to a wave, produced at said collector electrode of said second transistor in response to said input signal, to produce at said output terminal of said timing means a delayed gating signal having said polarity and a magnitude which attains said second value only at a time after the inception of said wave at least equal to said given time interval; and means for deriving an output signal from said output terminal of said second gating means.

4. A binary counter according to claim 3, wherein said four transistors each comprise a semiconductive base element connected to said base electrode and all of said base elements are of the same conductivity type, and wherein said first and second resistive means respectively include first and second resistors having resistances substantially equal to one another.

5. A binary counter according to claim 4, wherein said second gating means comprise fifth and sixth transistors each having an emitter electrode, a collector electrode, a semiconductive base element and a base electrode connected thereto, said base elements of said fifth and sixth transistors having the same conductivity type as said base elements of said first, second, third and fourth transistors, means connecting said emitter electrode of said fifth transistor to said collector electrode of said sixth transistor, resistive means connecting said collector electrode of said fifth transistor to said source of operating voltage, means directly connecting said collector electrode of said fifth transistor to said base electrode of said fourth transistor, means connecting said base electrode of said fifth transistor to said base electrode of said third transistor, means connecting said emitter electrode of said sixth transistor to said point at reference potential, and means connecting said output terminal of said timing means to said base electrode of said sixth transistor.

6. A binary counter according to claim 5, wherein said output-signal-deriving means comprises a seventh transistor having an emitter electrode, a collector electrode, a semiconductive base element and a base electrode connected thereto, said last-named base element having the same conductivity type as said base elements of said first six transistors, a load element connecting said collector electrode of said seventh transistor to said source of operating voltage, means connecting said emitter electrode of said seventh transistor to said point at reference potential, and means connecting said base electrode of said seventh transistor to said collector electrode of said fifth transistor.

7. A binary counter comprising a multivibrator having first and second transistors, each of said transistors having an emitter electrode, a collector electrode and a base electrode, means connecting said base electrode of said first transistor to said collector electrode of said second transistor, means connecting said base electrode of said second transistor to said collector electrode of said first transistor, first and second resistive means respectively connecting said collector electrodes of said first and second transistors to a source of operating voltage, and means connecting said emitter electrode of said second transistor to a point at reference potential; first gating means comprising third and fourth transistors each having an emitter electrode, a collector electrode and a base electrode, means connecting said emitter electrode of said third transistor both to said collector electrode of said fourth transistor and to said emitter electrode of said first transistor, means connecting said collector electrode of said third transistor to said collector electrode of said first transistor, and means connecting said emitter electrode of said fourth transistor to said point at reference potential; second gating means comprising fifth and sixth transistors each having an emitter electrode, a collector electrode and a base electrode, means connecting said emitter electrode of said fifth transistor to said collector electrode of said sixth transistor, means connecting said emitter electrode of said sixth transistor to said point at reference potential, and a resistive element connecting said collector electrode of said fifth transistor to said source of operating voltage; means directly connecting said collector electrode of said fifth transistor to said base electrode of said fourth transistor; means for supplying to said base electrodes of said third and fifth transistors an input pulse having a duration less than a given time interval; a timing circuit comprising a resistor and a capacitor connected serially and in the order named between said collector electrode of said second transistor and said point at reference potential, said timing circuit also comprising an inductor connected in parallel relationship with said resistor and means connecting the junction of said resistor and capacitor to said base electrode of said sixth transistor, said resistor, inductor and capacitor having respective values such that a pulse supplied to said timing circuit by said collector electrode of said second transistor, having a polarity with respect to said reference potential tending to drive said sixth transistor into conduction when applied to said base electrode thereof, and also having a magnitude with respect to said reference potential at least equal to the critical magnitude required to drive said sixth transistor into conduction, produces a delayed gating signal between said base and emitter electrodes of said sixth transistor having said last-named polarity and a magnitude with respect to said reference potential which attains said critical magnitude only at a time following the inception of said input pulse at least equal to said given time interval; and means coupled to said collector electrode of said fifth transistor for deriving an output signal.

8. A binary counter according to claim 7, wherein each of said six transistors comprises a semiconductive base element connected to said base electrode of said each transistor, and all of said base elements have the same conductivity type.

9. A binary counter according to claim 7, wherein said output-signal-deriving means comprises a seventh transistor having a base electrode, an emitter electrode and a collector electrode, means connecting said base electrode of said seventh transistor to said collector electrode of said fifth transistor, means connecting said emitter electrode of said seventh transistor to said point at reference potential and a resistive element connecting said collector electrode of said seventh transistor to said source of operating voltage.

10. The binary counter of claim 9, wherein each of said seven transistors comprises a semiconductive base element connected to its base electrode and all of said base elements have the same conductivity type.

11. A multivibrator system comprising first and second transistors each having an emitter electrode, a collector electrode and a base electrode; means connecting said collector electrode of said second transistor to said base electrode of said first transistor for applying a control signal to said base electrode of said first transistor; means connecting said collector electrode of said first transistor to said base electrode of said second transistor for applying a control signal to said base electrode of said second transistor, first and second resistive means for applying a given operating voltage to said collector electrodes of said first and second transistors respectively; means connecting said emitter electrode of said second transistor to a point at reference potential; and means for controlling the respective states of conduction of said first and second transistors, said controlling means comprising a third transistor having an emitter electrode, a collector electrode and a base electrode, means connecting said last-named emitter electrode to said point at reference potential, and means connecting said last-named collector electrode to said emitter electrode of said first transistor.

12. A multivibrator system comprising first and second transistors each having an emitter electrode, a collector electrode and a base electrode; means connecting said collector electrode of said second transistor to said base electrode of said first transistor for applying a control signal to said base electrode of said first transistor; means connecting said collector electrode of said first transistor to said base electrode of said second transistor for applying a control signal to said base electrode of said second transistor; first and second resistive means for applying a given operating voltage to said collector electrodes of said first and second transistors respectively; means connecting said emitter electrode of said second transistor to a point at reference potential; and means for controlling the respective states of conduction of said first and second transistors, said controlling means comprising third and fourth transistors each having an emitter electrode, a collector electrode and a base electrode, means connecting said emitter electrode of said third transistor to said emitter electrode of said first transistor and said collector electrode of said third transistor to said collector electrode of said first transistor, means connecting said collector electrode of said fourth transistor to said emitter electrode of said first transistor, and means connecting said emitter electrode of said fourth transistor to said point at reference potential.

13. A multivibrator system according to claim 12, wherein said four transistors have base elements of the same conductivity type; wherein said first and second resistive means respectively comprise first and second resistors having values respectively equal to each other; and wherein said gating means comprise means for supplying respective control signals to said base electrodes of said third and fourth transistors respectively.

14. A binary counter comprising: gating means having first and second input terminals and an output terminal, said gating means being responsive to first and second signals supplied to said first and second input terminals respectively to produce at said output terminal an electrical quantity of only a single sense and only when said first signal has a given sense and a magnitude at least equal to a given magnitude and concurrently said second signal has a given sense and a magnitude at least equal to a given magnitude; means for supplying to said first input terminal of said gating means first and second consecutive input pulses each having said sense and at least said given magnitude of said first signal; means supplied with and responsive to said first input pulse to apply to and to maintain at said second input terminal until the termination of said second input pulse a control quantity having both said sense and given magnitude of said second signal only after the completion of said first input pulse; and means responsive to said electrical quantity to terminate said control quantity after the expiration of said second input pulse.

15. A binary counter comprising: a bistable device having an output terminal and means including first and second input terminals for controlling the conduction state of said device; gating means having first and second input terminals and an output terminal; timing means coupling said output terminal of said bistable device to said second input terminal of said gating means; means for supplying the same input pulse to said first input terminals of said controlling means and said gating means, and means directly coupling said output terminal of said gating means to said second input terminal of said controlling means.

(References on following page)

References Cited in the file of this patent

UNITED STATES PATENTS

| | | |
|---|---|---|
| 2,594,336 | Mohr | Apr. 29, 1952 |
| 2,778,935 | Ropiequet | Jan. 22, 1957 |
| 2,846,594 | Pankratz | Aug. 5, 1958 |
| 2,858,429 | Heywood | Oct. 28, 1958 |
| 2,860,258 | Hall | Nov. 11, 1958 |
| 2,907,898 | Clark | Oct. 6, 1959 |
| 2,916,636 | Wanlass | Dec. 8, 1959 |
| 2,928,011 | Campbell | Mar. 8, 1960 |
| 2,945,965 | Clark | July 19, 1960 |

OTHER REFERENCES

Shea: Transistor Circuit Engineering, Wiley, 1957, page 335.